(12) United States Patent
Deladurantaye et al.

(10) Patent No.: US 8,263,903 B2
(45) Date of Patent: Sep. 11, 2012

(54) METHOD FOR STABLIZING AN OUTPUT OF A PULSED LASER SYSTEM USING PULSE SHAPING

(75) Inventors: Pascal Deladurantaye, St-Joseph de la Pointe-Levy (CA); Louis Desbiens, St-Augustin-de-Desmaures (CA); Yves Taillon, St-Augustin-de-Desmaures (CA); Dany Lemieux, Quebec (CA); Brian W. Baird, Portland, OR (US)

(73) Assignee: Institut National d'Optique, Quebec, Quebec (CA)

( * ) Notice: Subject to any disclaimer, the term of this patent is extended or adjusted under 35 U.S.C. 154(b) by 328 days.

(21) Appl. No.: 12/782,458

(22) Filed: May 18, 2010

(65) Prior Publication Data

US 2011/0284507 A1 Nov. 24, 2011

(51) Int. Cl.
  *B23K 26/42* (2006.01)
  *B23K 26/06* (2006.01)
  *B23K 26/073* (2006.01)
(52) U.S. Cl. .......... 219/121.85; 219/121.61; 219/121.62
(58) Field of Classification Search ............. 219/121.61, 219/121.62, 121.85
  See application file for complete search history.

(56) References Cited

U.S. PATENT DOCUMENTS

| | | | |
|---|---|---|---|
| 4,488,305 A | 12/1984 | Claverie et al. |
| 4,817,097 A | 3/1989 | Dufour |
| 5,151,909 A | 9/1992 | Davenport et al. |
| 5,226,051 A | 7/1993 | Chan et al. |
| 6,172,325 B1 | 1/2001 | Baird et al. |
| 6,281,471 B1 | 8/2001 | Smart et al. |
| 7,348,516 B2 | 3/2008 | Sun et al. |
| 2007/0228024 A1 | 10/2007 | Bruland et al. |
| 2007/0248136 A1 | 10/2007 | Leonardo et al. |
| 2008/0013163 A1 | 1/2008 | Leonardo et al. |
| 2008/0233715 A1 | 9/2008 | Liu et al. |
| 2008/0261382 A1 | 10/2008 | Starodoumov et al. |
| 2009/0010288 A1 | 1/2009 | Keaton et al. |

FOREIGN PATENT DOCUMENTS

| | | |
|---|---|---|
| EP | 0 053 974 A1 | 6/1982 |
| WO | WO 2009/155712 A1 | 12/2009 |
| WO | WO 2010/057290 A1 | 5/2010 |

OTHER PUBLICATIONS

Herre, P. et al. "Mode Switching of Fabry-Perot Laser Diodes", IEEE Journa of Quantum Electronics, Aug. 1989, vol. 25, No. 8, pp. 1794-1799.
U.S. Appl. No. 12/780,556, filed May 4, 2010.

*Primary Examiner* — Evan Pert
(74) *Attorney, Agent, or Firm* — Merchant & Gould P.C.

(57) ABSTRACT

A method for stabilizing an output of a pulsed laser system includes a directly modulated laser diode by mitigating the effect of switching transients on the temporal shape of the outputted pulses. The method includes controlling a pulse shaping signal to define, over time, processing and conditioning periods. During the processing periods, the pulse shaping signal has an amplitude profile tailored to produce the desired temporal shape of the output. Each conditioning period either immediately precedes or follows a processing period. During a given processing period, the amplitude profile of the pulse shaping signal is tailored so that the drive current of the laser diode is lower than its maximum value during the corresponding processing period, and is of the same order of magnitude as the laser threshold current of the laser diode. In this manner, the stability of the output during the corresponding processing period is improved.

10 Claims, 9 Drawing Sheets

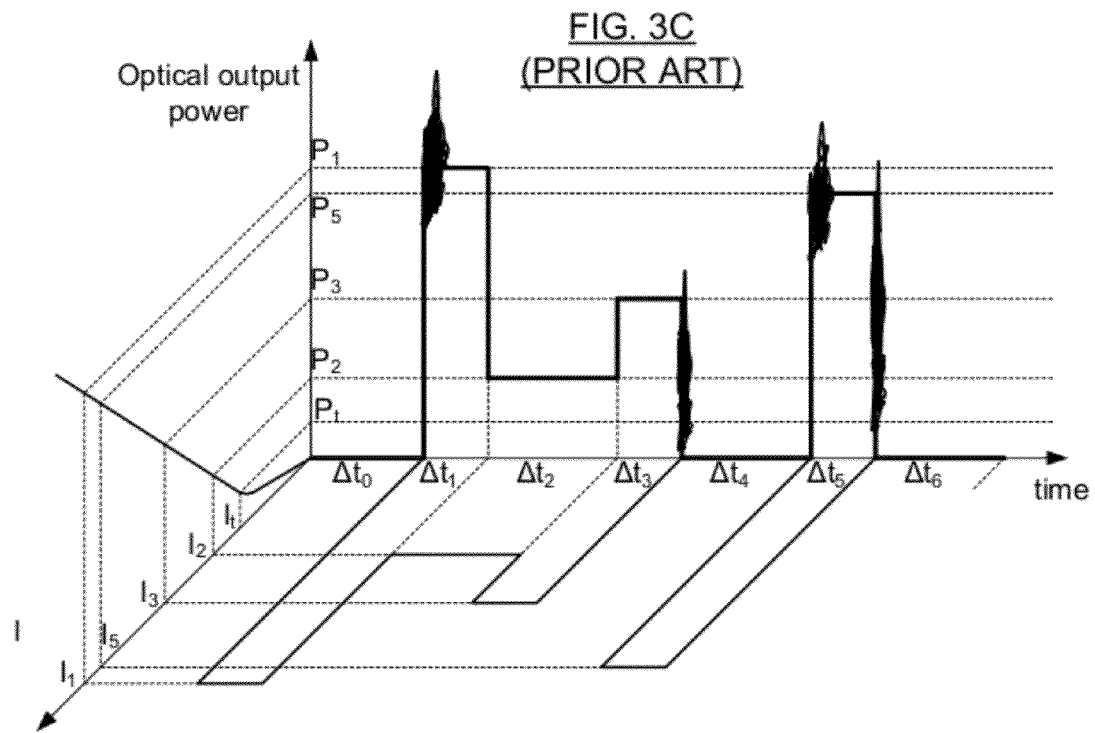
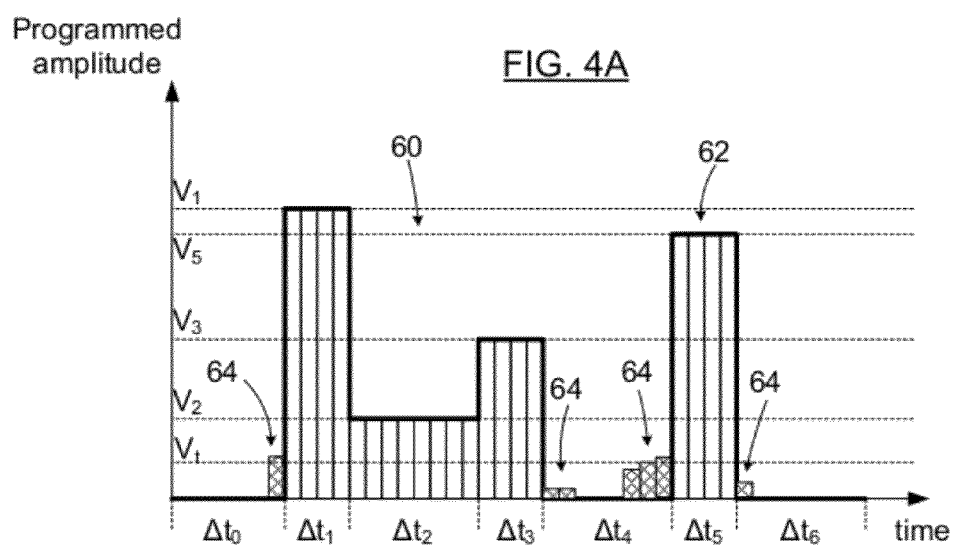

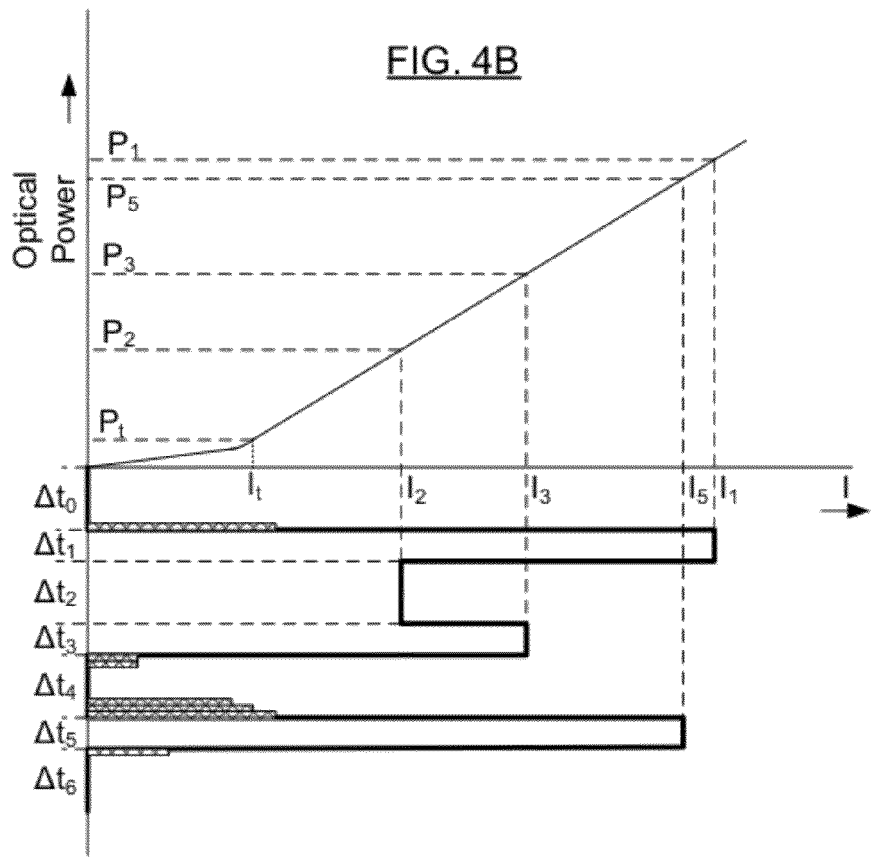
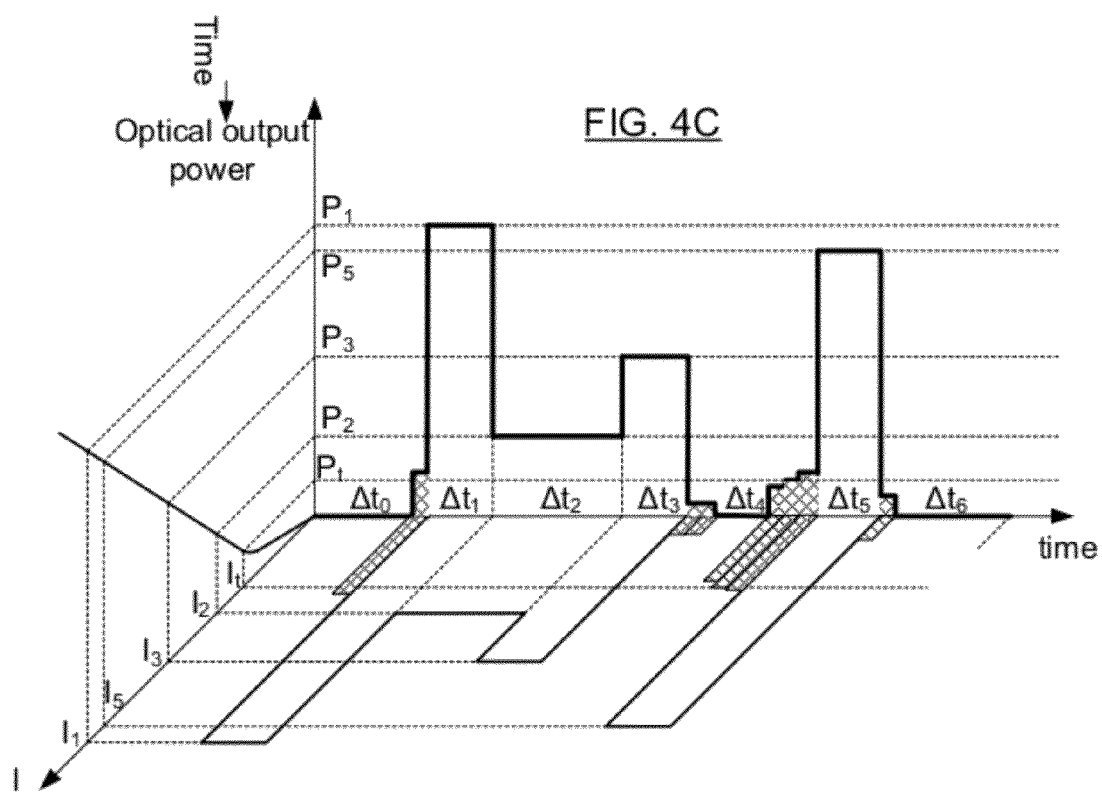

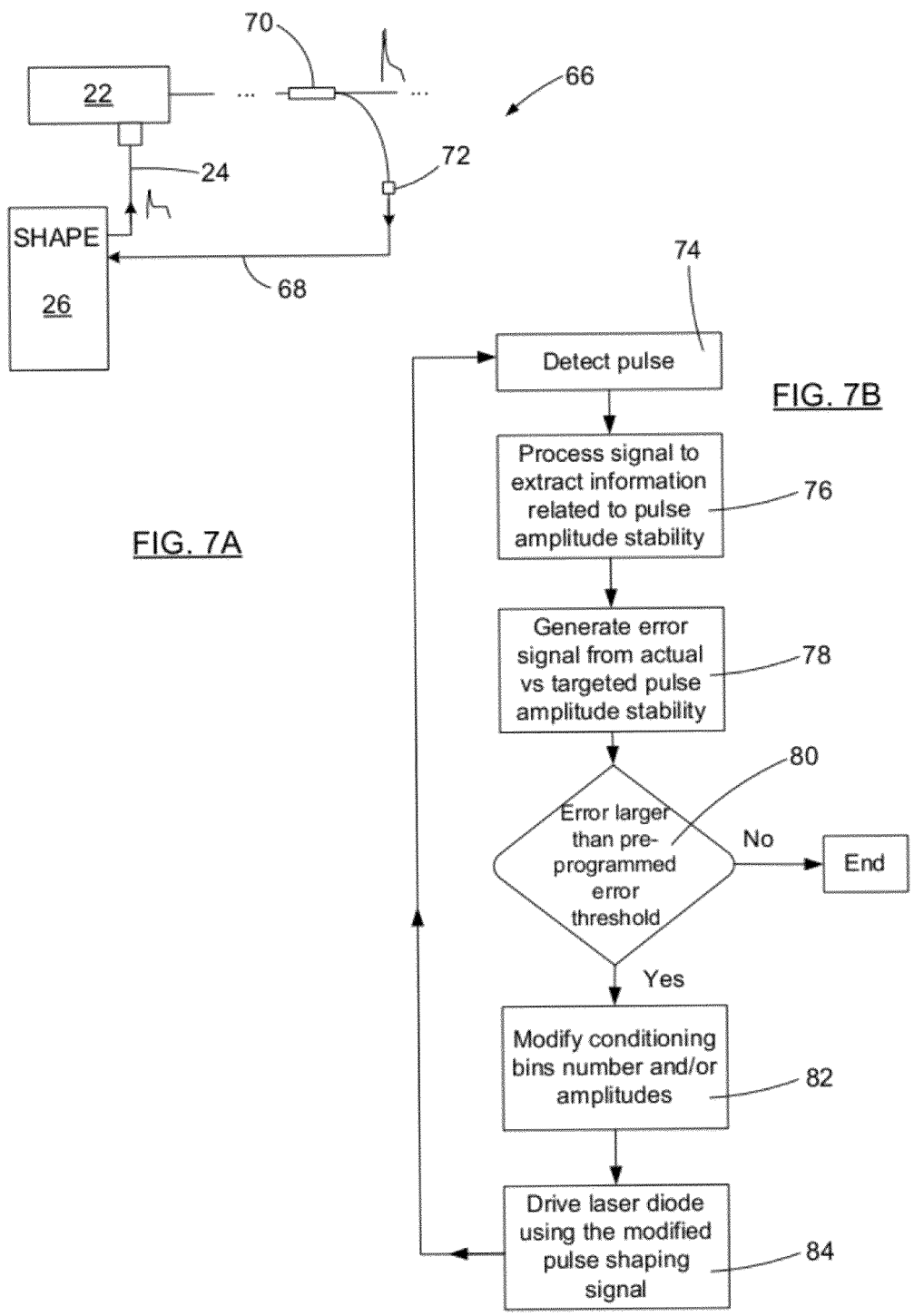

METHOD FOR STABLIZING AN OUTPUT OF A PULSED LASER SYSTEM USING PULSE SHAPING

FIELD OF THE INVENTION

The present invention relates to the field of pulsed lasers and more particularly concerns methods for pulse stabilization in tailored pulsed laser systems employing a directly modulated laser diode.

BACKGROUND

Seeding a pulsed fiber laser system with a directly modulated laser diode is a simple and cost-effective manner of generating high energy, high peak power optical pulses with fast rise times and fall times. In material processing applications where a single pulse is used to process a given structure, such as severing links for memory repair, it is important to keep the energy of the light pulses within a given range. If the pulse energy is too low, then the link may be incompletely removed. In cases where the energy per pulse exceeds the allowable energy process window, excess pulse energy may be coupled into adjacent or underlying link structures, or the substrate itself, thereby causing highly undesirable damage to the device. In multiple pulse laser processes, such as laser drilling of microvias in semiconductors, or laser scribing of thin film photovoltaic devices, it is important that successive pulses remain substantially uniform in order to produce laser processed features that possess the desired dimensions and surface quality. High value is placed upon the throughput of work pieces satisfactorily produced by a laser processing system. The control of the pulse amplitude stability is also important in laser surgery, as the amount of energy deposited in living tissues must be accurately controlled in order to avoid causing damage to the neighbouring tissues. Therefore, methods to achieve pulse stabilization in lasers, particularly in lasers employed in laser processing or medical laser systems, are highly desirable.

Optical pulse shaping is of great interest in material processing applications as it offers the ability to control how the energy is delivered to the target over time. Industrially important laser applications, such as laser repair of dynamic random access memory (DRAM), laser scribing of photovoltaic cells, and laser drilling of microvias in semiconductor, flexible interconnects, IC packages, dielectrics, including glass, and metals, can benefit from a pulsed laser output characterized by tailored pulse shapes. For example, U.S. Pat. No. 7,348,516 (SUN et al.), entitled "Methods of and laser systems for link processing using laser pulses with specially tailored power profiles" presents many arguments in favour of pulsed laser systems providing fine control over the pulse temporal power profile in the nanosecond regime, for facilitating better link process quality and yield. Those skilled in the art will recognize that laser sources capable of generating sharp optical pulses with stable, tailored amplitude profiles characterized by fast rise times and fall times at the nanosecond time scale are highly desirable for such purposes. Elaborate optical pulse shapes require a highly responsive optical shaping mechanism. Pulsed lasers based on a directly modulated laser diode seeding a chain of optical amplifiers in a Master Oscillator, Power Amplifier (MOPA) configuration are commonly employed in these and similar laser processing applications in which laser processing pulses with controllable pulse amplitude profiles are highly beneficial (See for example U.S. Pat. No. 6,281,471 (SMART), entitled "Energy-efficient, laser-based method and system for processing target material". Embodiments of pulsed laser oscillator platforms employing MOPA configurations with a directly modulated seed laser diode and providing fine control over the pulse parameters are presented in the international patent application published under WO 2009/155712 (DELADURANTAYE et al), entitled "Digital laser pulse shaping module and system" and in international patent application No. PCT/CA2009/00365 (DELADURANTAYE et al), filed on 20 Mar. 2009, entitled "Spectrally tailored pulsed fiber laser oscillator".

For pulsed laser systems employing a directly modulated seed laser diode, a commonly encountered difficulty is obtaining a satisfactory optical pulse amplitude stability on the leading edge of the pulse, as switching transients often take place in the diode during the transitory regime corresponding to the leading edge of the current pulse. The pulse amplitude stability usually worsens as the pulse rise time is shortened and as the pulse amplitude is increased. Similar transients can occur at the falling edge of the pulse, and generally, transients can be observed for each low to high or high to low transition present in a given pulse shape. Those transients may find their origin in the optical gain switching dynamics taking place in the laser diode cavity as longitudinal mode competition occurs when the drive current is suddenly increased from zero to a value that is above the laser emission current threshold. See for example "Mode switching of Fabry-Perot laser diodes", by P. J. Herre and U. Barabas, in IEEE Journal of Quantum Electronics, Vol. 25, No. 8, August 1989, pp. 1794-1799. FIG. 1 (PRIOR ART) shows an example of the temporal shape of an outputted optical pulse where such transient behavior is manifested by a spike present at the pulse leading edge. In general, the spike amplitude varies from pulse to pulse, leading to poor peak power stability at the pulse leading edge. Parasitic capacitances and inductances associated with the details of the laser diode physical characteristics and packaging can also contribute to create noise at the current transitions.

In a MOPA configuration (Master Oscillator Power Amplifier), any undesirable features present at the seed level will be amplified. As those skilled in the art will recognize, this effect is often worsened when the pulsed oscillator output is amplified and frequency converted to one or more harmonic wavelengths using the process of nonlinear harmonic conversion, as is well known in the art. Other issues can arise from the presence of peak power instabilities. For example, when fiber amplifiers are used to amplify the pulsed seed signal, excessive peak power induced by the transient behavior can trigger the onset of Stimulated Brillouin Scattering (SBS) or other nonlinear processes in the fibers, which can degrade the performances of the laser and in some cases even cause damage to it. It is consequently of very high interest to have methods for controlling the switching transients of a laser diode operated in the pulsed mode in a very predictable way in the context of flexible pulsed laser oscillators based on a MOPA architecture.

Previous works have described certain methods for mitigating switching transients in other fields of use, such as laser diode drivers used in CD-recorders. For example, CLAVERIE, in European Patent No. 0,053,974, discloses a method to reduce the effects of the switching transients by superposing to the information-containing current pulses a d.c. current with a slightly smaller amplitude than the laser-threshold current. However this method is not very attractive for pulsed lasers having a MOPA architecture and relying on a directly modulated semiconductor laser, because the pedestal (d.c.) current would generate a continuous wave emission background between the pulses, which in turn would deplete the population inversion in the subsequent amplifier stage by stimulated emission. This amplifier gain reduction can substantially reduce the energy delivered in each pulse, especially for regimes of operation corresponding to low duty cycles (e.g. 10% or less), since the relative proportion of energy contained in the pedestal with respect to the energy contained in the pulse increases as the duty cycle is reduced. Such low duty cycle operation regimes are not exceptional for many material processing applications, where pulse durations in the range of 1 to 50 ns at repetition rates of a few hundreds of kilohertz are commonly required by practitioners. Another drawback associated with the continuous background is that the optical power emitted between the triggered optical pulses can cause damage to the work piece between the different targets. As will be recognized by those skilled in the art, the maximum energy impinging on the work piece between targets must be kept lower than a certain threshold value, above which scorching of the material begins to take place.

Even in its field of use, the method of CLAVERIE suffers from the drawback of shortening the lifetime of the semiconductor laser, as mentioned by DUFOUR in U.S. Pat. No. 4,817,097, entitled "Method of and device for pulse-mode driving a semi-conductor laser". Alleviating the lifetime issue, DUFOUR's approach consists of using two superposed current pulses. A first pedestal current pulse generated by a first current source is used to drive the laser diode into the LED region (that is, using a current lower than the laser-threshold current). A second current source is used to generate an information current pulse that is superposed to the pedestal current pulse, both current pulses being synchronized. This two-stage drive approach allows for a reduction of the switching transients while avoiding unnecessary power dissipation between the information pulses, which is beneficial as it extends the laser diode lifetime. Although this method would certainly work better than the method of CLAVERIE in the context of pulsed laser oscillators having MOPA architectures (as the inter-pulse background would not be present), it imposes a more complex laser diode driving circuit, which represents an additional cost. Furthermore, as those skilled in the art will recognize, an increased component count in the vicinity of the laser diode package usually represents additional difficulties for reaching fast rise times and fall times, because the complex impedance usually increases along with the circuit footprint.

Therefore, improved pulse stabilization methods well-adapted for flexible laser oscillators based on directly modulated seed laser diodes are of substantial interest and value to practitioners in many industrially important applications.

SUMMARY OF THE INVENTION

In accordance with one aspect of the invention, there is provided a method for stabilizing an output of a pulsed laser system, this output being controlled using a pulse shaping signal directly modulating a drive current of a laser diode within the laser system to obtain a desired temporal shape of the output. The method comprises controlling the pulse shaping signal to define, over time:
  at least one processing period wherein the pulse shaping signal has an amplitude profile tailored so as to produce the desired temporal shape of the output; and
  at least one conditioning period, either immediately preceding or immediately following one of the at least one processing periods, wherein the amplitude profile of the pulse shaping signal is tailored so that the drive current of the laser diode is lower than a maximum value of the drive current during the corresponding processing period, and is of the same order of magnitude as a laser threshold current of said laser diode, whereby the stability of the output during the corresponding processing period is improved.

Advantageously, embodiments of the invention provide a solution for mitigating switching transients when directly modulating a laser diode in the context of laser oscillators, offering pulse shape flexibility. Preferably, using a stabilizing method according to the present invention does not impose a continuous wave (CW) background between the optical pulses, nor does it require additional hardware or circuit elements specifically dedicated to the mitigation of switching transients. The proposed method instead relies on pulse shaping techniques to efficiently mitigate the transients.

Other features and advantages of the present invention will be better understood upon a reading of the preferred embodiments thereof, with reference to the appended drawings.

BRIEF DESCRIPTION OF THE DRAWINGS

FIG. 3C (PRIOR ART) is a graph showing the power of the outputted waveform from a semiconductor laser diode, to which has been applied the pulse shaping signal of FIG. 3A.

FIG. 4A shows the amplitude profile of an example of a pulse shaping signal according to an embodiment of the invention. FIG. 4B is a graph representing the output power curve as a function of drive current curve for a semiconductor laser diode, along with the current pulse applied to the diode and resulting from the pulse shaping signal of FIG. 4A. FIG. 4C is a graph showing the power of the outputted waveform from a semiconductor laser diode, to which has been applied the pulse shaping signal of FIG. 4A.

FIG. 7A is a schematic illustration of a pulse system associated with a retroaction loop; FIG. 7B is a flow chart illustrating steps of a method using the retroaction loop of FIG. 7A.

DESCRIPTION OF PREFERRED
EMBODIMENTS OF THE INVENTION

The present invention generally provides methods for stabilizing an output of a pulsed laser system. Embodiments of the present invention may advantageously be applied in the context of applications such as memory repair, milling, micro-fabrication, drilling and other material processing applications. It will be understood that embodiments of the present invention may also be used in other contexts, such as medical laser devices, remote sensing or any other application which may benefit from optical pulses having good optical characteristics.

Pulsed Laser System

The expression "pulsed laser system" is understood to refer to any grouping of components outputting an optical beam having a varying intensity as a function of time. Generally, the outputted light defines a succession of high power "peaks", or "pulses", separated by gaps where the outputted optical power is low or absent. It will be understood by one skilled in the art that the consecutive pulses of a given outputted light beam may vary in duration and intensity, and that the repetition rate of the optical beam need not be constant. As a matter of fact, embodiments of the present invention may be particularly useful in industrial applications, where the temporal profile of the outputted beam is often customized according to the particular needs of a given process.

Figure 1:
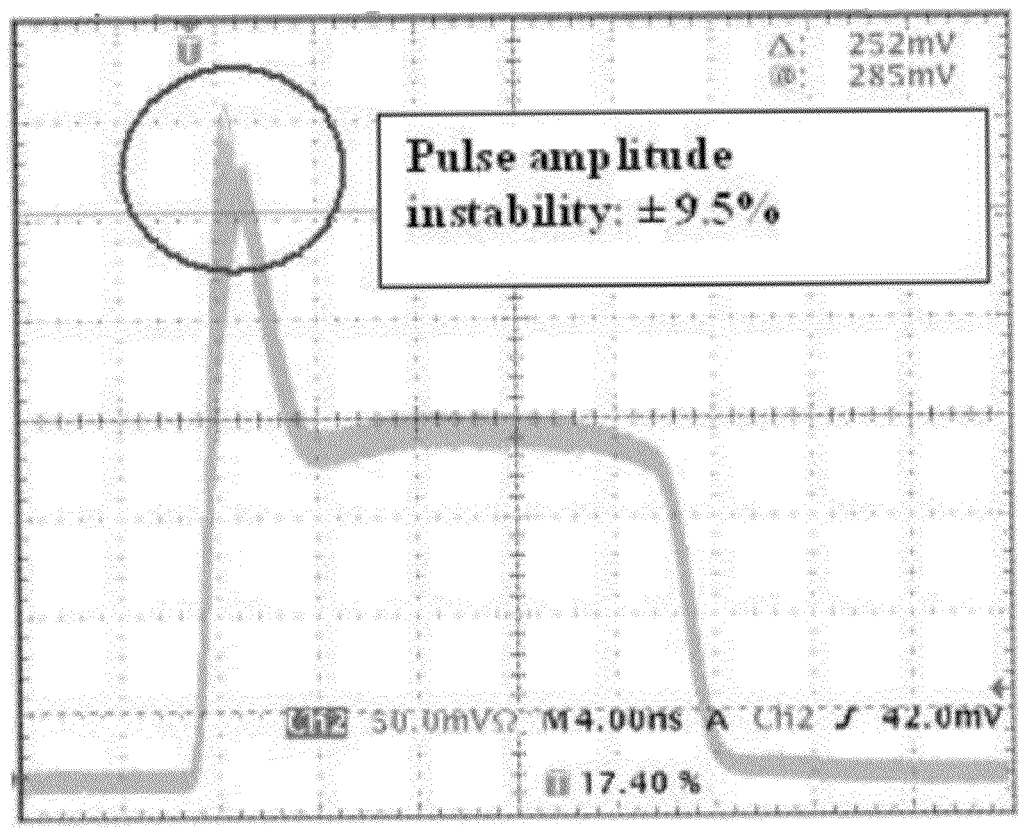
FIG. 1 is a graphical representation of the temporal shape of an optical pulse affected by a switching transient at its leading edge.
Figure 2A:
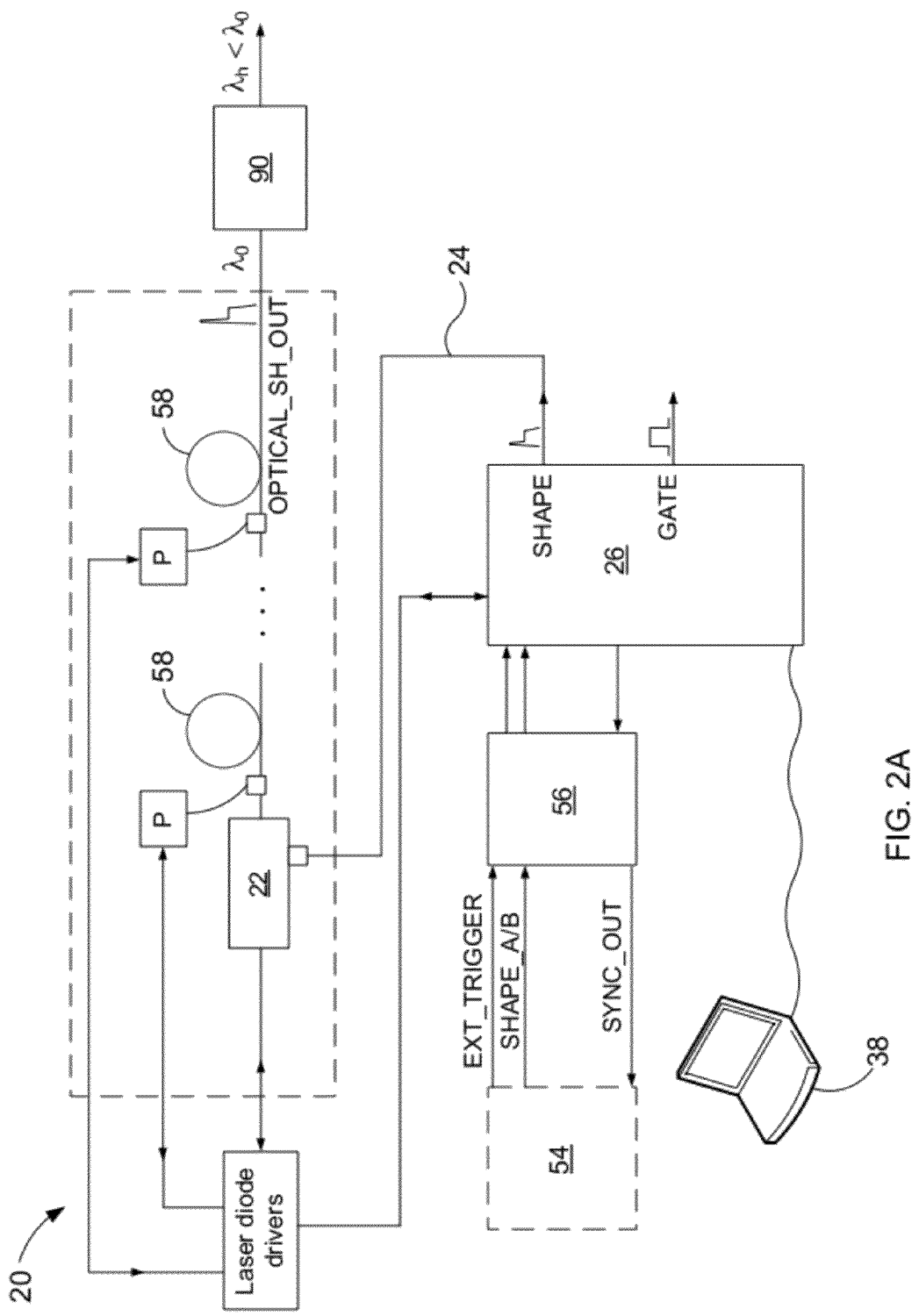
FIG. 2A is a schematic illustration of a pulsed laser system which may be used to embody the present invention.

Referring to FIG. 2A, there is shown an example of a laser system 20 to which a method according to embodiments of the invention may be applied. Such a system is, for example, shown in the international patent application published under WO 2009/155712 (DELADURANTAYE et al), the contents of which are incorporated herein by reference.

The pulsed laser system 20 includes a laser diode 22. The expression "laser diode" is understood to refer to a laser with a semiconductor-based gain medium. The laser diode 22 may be embodied by various types of diodes such as Fabry-Perot laser diodes, DFB (distributed feedback) laser diodes, DBR (distributed Bragg reflector) laser diodes, external cavity laser diodes and the like. The laser diode 22 may be wavelength-locked or wavelength-tunable, that is, the wavelength of spectral profile of the outputted light may be fixed or controllable. An example of an appropriate laser diode for use in flexible pulsed laser systems is the laser diode model 11064.3SB0050P from Innovative Photonics Solutions, which is an external-cavity laser diode including a wavelength selective feedback element.

Of course, the pulsed laser system 20 may include any number of components amplifying, shaping, focusing or otherwise acting on the optical pulses outputted by the laser diode 22. By way of example, in the illustrated embodiment of FIG. 2A, the pulsed laser system 20 has a MOPA configuration and includes two or more optical fiber amplifiers 58, each pumped by a pump P. Other components may be included, such as amplitude modulators, phase modulators, circulators, reflectors such as Bragg gratings or the like, isolators, etc. One skilled in the art will be readily familiar with a number of possible configurations for the pulsed laser system 20 and may also refer to WO 2009/155712 (DELADURANTAYE et al) for additional examples.

In the illustrated embodiment, the output of the pulsed laser system 20 is passed through an optical harmonic converter 90, which converts the fundamental wavelength $\lambda_0$ of the output to a harmonic $\lambda_h$ thereof. The resulting wavelength $\lambda_h$ is shorter than the fundamental wavelength, as will be well understood by one skilled in the art. The optical harmonic converter may for example be based on a non-linear crystal, and may be internal or external to the pulsed laser system 20. As the harmonic conversion process can worsen the impact of the transients in the shape of the optical pulses subjected thereto, such a system can greatly benefit from mitigation techniques as disclosed herein.

The output of the pulsed laser system 20 is controlled using a pulse shaping signal 24 directly modulating the drive current of the laser diode 22; by changing the value of the drive current fed to the laser diode, the amplitude of the outputted light beam is changed accordingly, thereby obtaining the desired temporal shape of the output.

According to one embodiment of the invention, the pulse shaping signal 24 is generated by a digital pulse shaping module 26. The digital pulse shaping module 26 controls the laser diode 22 according to a digital input waveform. The digital input waveform is preferably a sequence of digital samples which may be defined or selected by a user, and which determine the resulting temporal shape of at least one pulse to be outputted by the laser diode 22.

In the embodiment of FIG. 2A, The pulsed laser system 20 is preferably adapted to interact with user equipment 54, which enables a user to interact and control the laser system according to desired operation parameters. A connector interface 56 preferably interfaces communication between the digital pulse shaping module 26 and the user equipment 54. The user equipment 54 may be embodied by any appropriate device or combination of devices such as, for example, a memory repair system, a photovoltaic cell scribing system, a micro-via drilling system or a laser surgery system.

Each electrical shape output by the digital pulse shaping module 26 may be triggered either by an internal or an external trigger signal. Preferably, the connector interface 56 provides an external trigger signal EXT_TRIGGER to the digital pulse shaping module 26 in response to a trigger command from the user equipment 54. The connector interface 56 also optionally outputs a trigger synchronization signal SYNC_OUT, having a predetermined timing relationship with respect to a light pulse emitted by the laser oscillator responsive to the external trigger signal EXT_TRIGGER.

In one embodiment of the invention, the pulsed laser system allows switching between two input waveforms preselected by the user, hereinafter referred to as SHAPE_A and SHAPE_B. The connector interface 56 preferably provides a shape switching signal SHAPE_A/B for dynamically switching the output from one of the preselected waveforms to the other, in response to a shape selection command from the user equipment 54.

In the illustrated embodiment, the shape or amplitude profile of the optical pulses can be programmed in a straightforward manner using a computer 38. To program a pulse shape in the pulse shaping signal 24, the system user preferably enters a series of amplitudes (amp1, amp2, . . . , ampn) corresponding to a series of concatenated temporal "bins", or time slots, of equal duration (typically 2.5 ns or less). A high speed digital to analog converter (DAC) then converts this digital shape into an analog pulse having the desired shape. The analog pulse is then used to drive the laser diode with a current pulse having the desired shape. Additional components may be further provided to adapt the analog pulse for feeding into the laser diode, such as buffers, amplifiers and the like. One example of a drive circuit adapted for this purpose is shown in co-assigned U.S. patent application Ser. No. 12/780,556 (DESBIENS et al) filed on May 14, 2010. The laser diode then emits an optical pulse having an amplitude profile (over time) substantially faithful with respect to the digital (or programmed) shape.

Of course, the pulsed laser system may have a configuration different than the one illustrated in FIG. 2A and include any additional digital, analog or optical components as appropriate for a given application, as would be readily devised by one skilled in the art.

Stabilizing Method

In general, the optical pulse shape outputted by the laser system 20 will exhibit some distortions with respect to the programmed shape. Several factors can contribute to this distortion, such as the limited bandwidth of the laser diode current driver, the limited bandwidth of the laser diode itself, the optical gain saturation taking place in the different optical amplifier stages, the nonlinear transfer function of some components such as nonlinear crystals, etc. In order to distinguish between the optical pulse shape and the programmed pulse shape, the latter is denoted herein as an oscillator preform seed pulse (OPSP).

In accordance with an aspect of the present invention, there is provided a method for stabilizing the output of a pulsed laser system, such as the one of FIG. 2A or the like, by mitigating the effect of switching transients on the temporal shape of the outputted pulses.

The method includes controlling the pulse shaping signal to define, over time, two types of periods which arise sequentially: processing periods and conditioning periods.

During the processing periods, the pulse shaping signal has an amplitude profile tailored so as to produce the desired temporal shape of the output, as is generally known in the art and taught, for example, by DELADURANTAYE et al. in WO 2009/155712. As mentioned above, different outputted pulses may have a different intensity, width and shape. The pulse shaping signal may define a single processing period, the laser system thereby outputting a single pulse. Alternatively, the pulse shaping signal may define a succession of processing periods, which may be identical or different, and which may be generated at a constant or irregular repetition rate. During any given processing period, the pulse shaping signal may have a constant amplitude, thereby defining a square pulse, or may advantageously have a tailored amplitude profile defining a more complex pulse shape.

The expression "processing period" is meant to refer to portions of time where the laser system outputs a light beam that can be used for carrying out a specific duty. In several applications, the optical pulses outputted during the processing periods are used to "process" a target, such as performed, for example, in the laser drilling of microvias in semiconductors, or the laser scribing of thin film photovoltaic devices. However, it will be understood that any use of a pulsed light beam may be considered a "process", and that embodiments of the present invention are not limited to applications generally referred to as "material microprocessing".

In accordance with an aspect of the invention, at least one conditioning period is provided. Each conditioning period either immediately precedes or immediately follows one of the processing periods. By "immediately" it is understood that the conditioning period is close enough to the corresponding processing period that the current provided to the laser diode during the former has a significant impact on the laser dynamics during the latter.

It is further understood that the method of the present invention encompasses any pulse shaping signal where at least one processing period is preceded and/or followed by a corresponding conditioning period. Of course, in a given application, a pulse shaping signal may define a plurality of processing periods, and each of these processing periods may be associated to a conditioning period either before, after or both. It is also possible that some of the processing periods within a given pulse shaping signal may not be associated with a conditioning period at all. One skilled in the art will understand that a given pulse shaping signal may include any appropriate combinations of processing and conditioning periods.

During the conditioning period, the amplitude profile of the pulse shaping signal is tailored so that the drive current of the laser diode has the following characteristics: it is lower than the maximum value of the drive current during the corresponding processing period, and is of the same order of magnitude as the laser threshold current of the laser diode. Preferably, the amplitude profile of the pulse shaping signal is such that the drive current of the laser diode is lower than twice the laser threshold current of the laser diode. It has been found that in such conditions, the stability of the output during the corresponding processing period is improved.

In embodiments of the invention, the method above may be accomplished by tailoring OPSPs so that the amplitudes of a number of bins preceding a leading edge or following a falling edge in a given pulse amplitude profile are adjusted to values corresponding to current amplitudes that are close to the laser threshold current.

Preferably, the one or more conditioning periods are provided right before a low to high transition, or right after a high to low transition contained in the same OPSP. The expression "high" is understood to refer to a programmed amplitude corresponding to a drive current higher than or equal to the threshold current, whereas "low" is understood to refer to a programmed amplitude corresponding to a current lower than the laser threshold current.

A conditioning period may be embodied by a single bin. Advantageously, it may contain several bins, which allows for a lot of flexibility, as tailored waveforms can be used in a given conditioning period to mitigate the switching transients. This flexibility is quite beneficial, as no hardware modifications are required when variations (e.g. in the laser diode manufacturing process) leading to different transient responses occur, or when different models of laser diodes having different transient response characteristics are employed for addressing different material processing applications. The programmable aspect of a preferred embodiment of the method allows the adjustment of the number and amplitude of the bins in the conditioning periods, so as to efficiently improve the pulse amplitude stability in the processing periods without adding circuit elements and without changing any part of the system design.

One skilled in the art will readily understand that any pulsed laser system providing an appropriate measure of pulse shaping may be adapted to enact the method of the present invention. By way of example, the section below describes such a pulsed laser system incorporating an appropriate pulse shaping module.

Example of Pulse Shaping Module

Figure 2B:
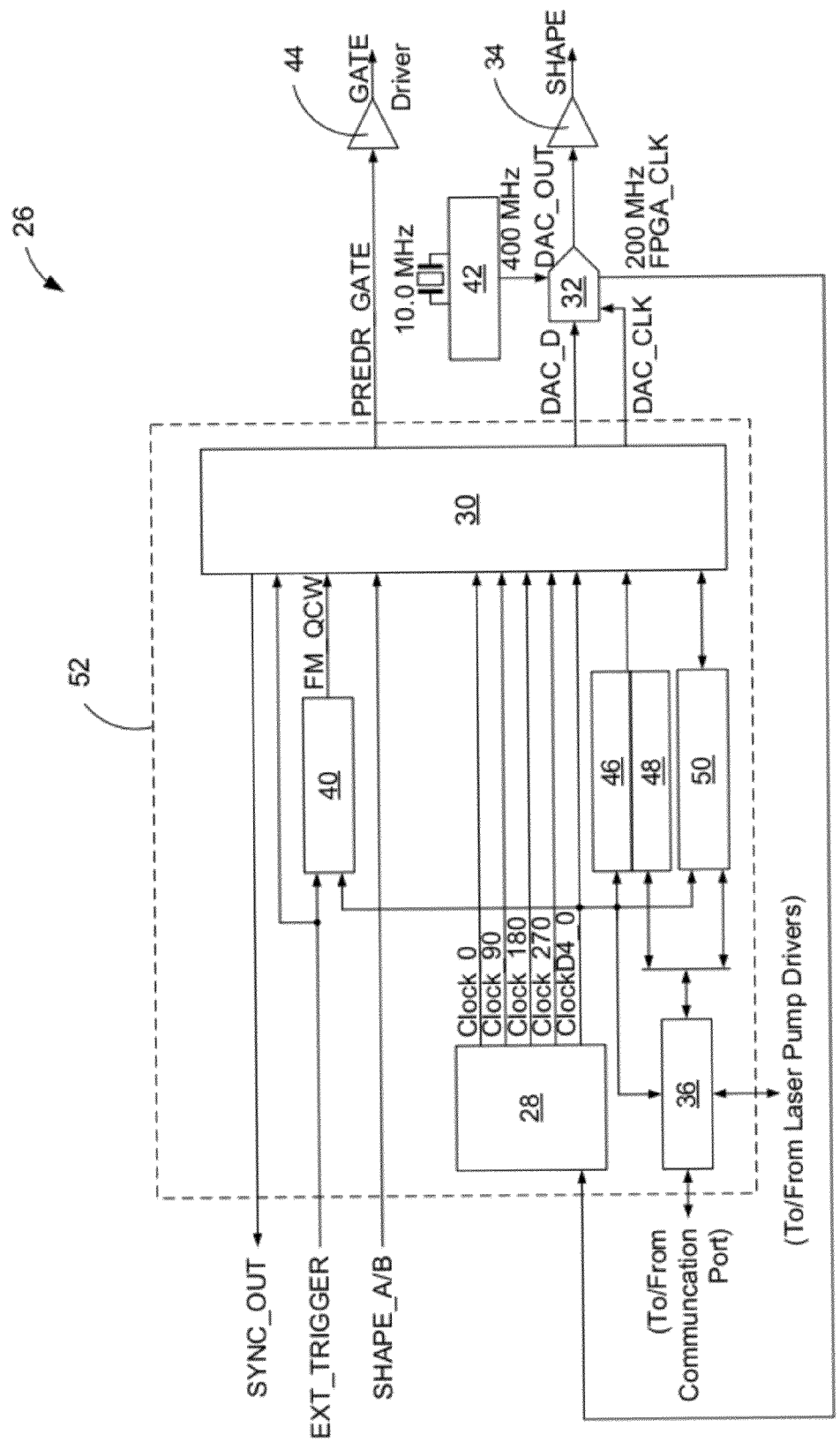
FIG. 2B is a schematic representation of the digital pulse shaping module part of the pulsed laser system of FIG. 2A.

Referring to FIG. 2B, a digital pulse shaping module 26 is shown, which may be used to embody the invention.

The digital pulse shaping module 26 generally includes a clock generator 28 generating a plurality of phase-related clock signals at a same clock frequency, and a shape generator 30 outputting a digital shape signal DAC_D corresponding to the digital input waveform. The phase-related clock signals from the clock generator 28 are used as timing signals in the shape generator 30, preferably in a double data rate configuration, hereinafter referred to as "DDR". In one embodiment, the digital shape signal DAC_D from the shape generator 30 is either pulse shape data or quasi-continuous data. The pulse shaping module 26 further includes a Digital-to-Analog Converter 32, hereinafter DAC, receiving the digital shape signal DAC_D from the shape generator 30 and converting it into an analog shape signal DAC_OUT. In the illustrated embodiment, the digital pulse shaping module 26 further includes a shape buffer driver 34 receiving the analog shape signal DAC_OUT from the shape generator 30 through the DAC 32 and generating the pulse shaping signal 24 adapted for controlling the laser diode. A microcontroller 36 is preferably used for controlling the communications with the internal sub-systems of the laser diode (pump drivers, etc.) and with the host computer 38 (shown in FIG. 2A).

The plurality of phase-related clock signals generated by the clock generator 28 includes a Clock_0 signal, and Clock_90, Clock_180 and Clock_270 signals respectively lagging a quarter of a period, half a period and three-quarters of a period behind the Clock_0 signal. In one embodiment, the phase-related clock signals are driven at 200 MHz. The clock generator 28 further preferably outputs a slow clock signal CLKD4_0 at 50 MHz, used mainly for clocking the slower elements in the design.

A frequency measurement module 40 is provided for measuring the frequency of the external trigger signal EXT_TRIGGER from the connector interface.

The DAC 32 may, for example, be embodied by the AD9736 model (trademark) from Analog Devices. The interface to the DAC 32 is preferably differential LVDS, 10-bit source-synchronous with the 200 MHz clock signal, DAC_CLK. The data is inputted into the DAC 32, in double data rate, on each rising edge and each falling edge of DAC_CLK.

The analog output DAC_OUT of the DAC 32 is either 100 MHz QCW or an analog pulse shape. This signal is inputted to the shape buffer driver 34, which is selected amongst devices appropriate for the laser diode. As such, the shape buffer driver 34 preferably has a very high slew rate, and is capable of driving a 50-Ohm load. This driver can use the Texas Instruments THS3102 amplifier (trademark), or a parallel combination of a few such amplifiers. If desired, the output of the shape buffer driver 34 may be transformer-coupled to the laser diode. The resulting output signal is the pulse shaping signal 24 which is inputted to MOD1 of the laser diode.

A low-jitter frequency synthesizer 42, such as the IDT ICS8442 (trademark) with a 10 MHz crystal, outputs a 400 MHz clock signal to the DAC 32. The DAC 32 divides this frequency down to 200 MHz to output the FPGA_CLK signal used by the clock generator 28.

In one embodiment, the shape generator 58 also outputs the PREDR_GATE signal, either in QCW or pulse mode. This output has a fixed amplitude and is also buffered similarly to the DAC_OUT, with a gate buffer driver 44, for example a THS3102 type amplifier, to drive the laser source. The resulting buffered output is the GATE signal that is inputted to MOD2 of the laser source.

Peripherals such as a timer 46, read/write registers 48, dual-port shape memory buffers 50 and the like may additionally be provided as would be readily understood by one skilled in the art, all of which are preferably mapped on the bus of the microcontroller 36.

Preferably, the microcontroller 36, clock generator 28, shape generator 30 and related peripherals are embedded on a high speed digital logic circuit 52. In the different embodiments of the present invention, high speed digital logic circuits available in technologies such as ASIC or FPGA or off-the-shelf digital ICs and high speed Digital-to-Analog Converters (DAC) may be used to implement the desired pulse shaping capability.

EXAMPLES

The section below provides examples of pulse shaping signals incorporating processing and conditioning periods according to embodiments of the invention. Of course, it will be readily understood that these examples are given for illustrative purposes only, and are in no way considered limitative to the scope of the present invention.

Figure 3A:
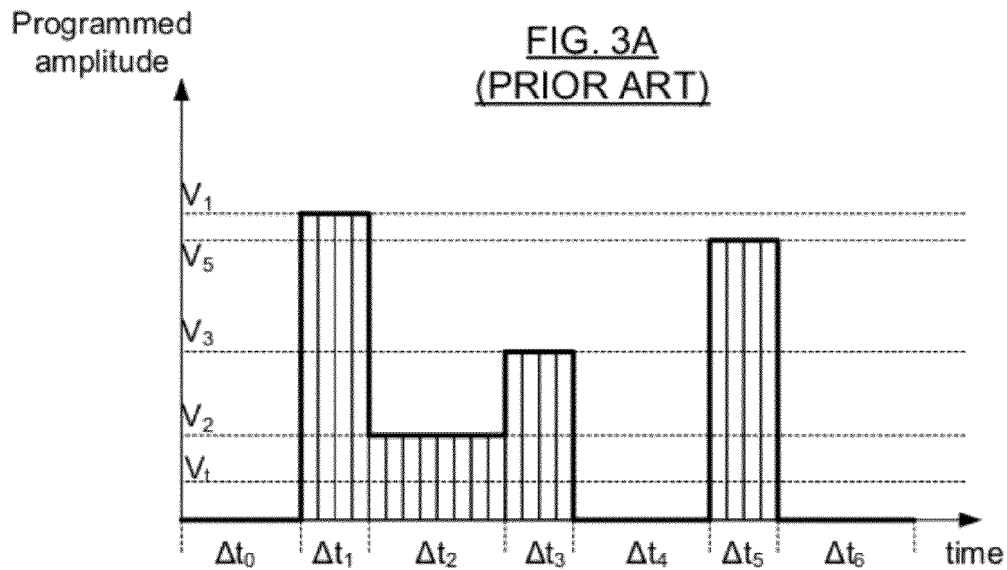
FIG. 3A (PRIOR ART) shows the amplitude profile of an exemplary pulse shaping signal according to prior art.

FIG. 3A (PRIOR ART) shows an example of an OPSP containing 43 temporal bins, as could be readily programmed as explained above. The amplitude profile is characterized by six main intervals in the time domain with uneven durations, denoted by $\Delta t_0$, $\Delta t_1$, $\Delta t_2$, $\Delta t_3$, $\Delta t_4$, $\Delta t_5$ and $\Delta t_6$, the programmed amplitude being adjusted to a specific and constant value for each interval. There are four non-zero distinct amplitude values, denoted by $V_1$, $V_2$, $V_3$ and $V_5$, corresponding to the time slots $\Delta t_1$, $\Delta t_2$, $\Delta t_3$ and $\Delta t_5$, respectively. In the given example, the time slots $\Delta t_0$, $\Delta t_4$ and $\Delta t_6$ contains 7, 8 and 8 bins respectively, with all amplitudes set to zero. In FIG. 3A, $V_t$ denotes the amplitude corresponding to the seed laser diode laser-threshold current. Therefore, all non-zero programmed amplitudes in this OPSP correspond to drive currents that are higher than the laser-threshold current.

Figure 3B:
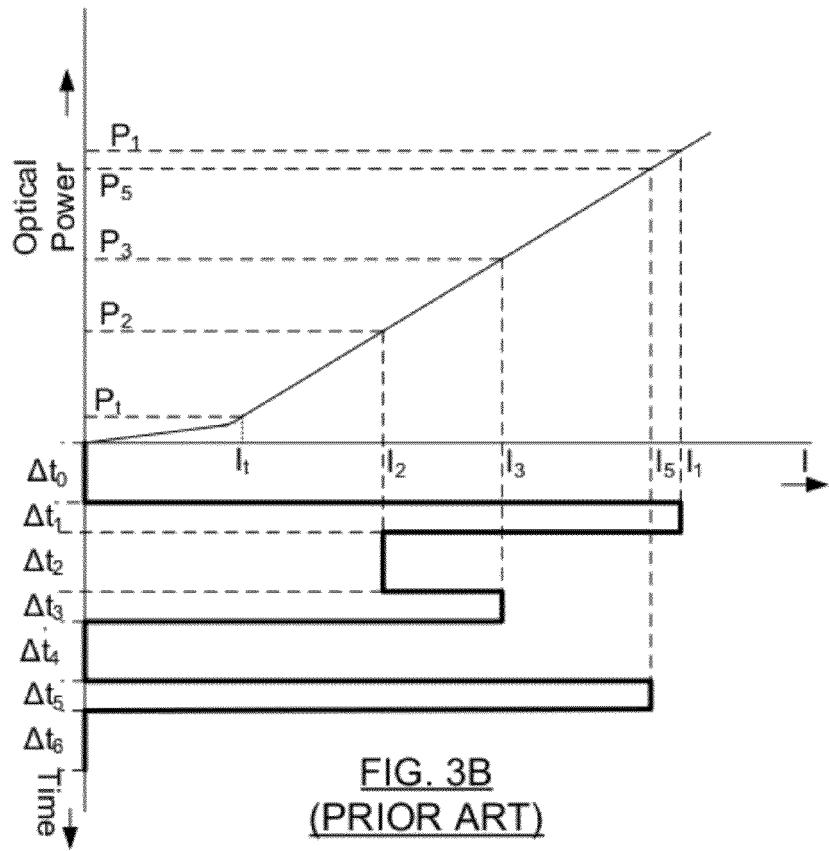
FIG. 3B (PRIOR ART) is a graph representing the typical output power curve as a function of the drive current curve for a semiconductor laser diode, along with the current pulse applied to the diode and resulting from the pulse shaping signal of FIG. 3A.

FIG. 3B (PRIOR ART) illustrates the seed laser diode output power levels $P_1$, $P_2$, $P_3$ and $P_5$ corresponding to the non-zero currents $I_1$, $I_2$, $I_3$ and $I_5$ flowing through the junction as the current pulse generated from the OPSP shown in FIG. 3A is used to drive the laser diode. The upper part of the graph shown in FIG. 3B represents the typical output power vs drive current curve for a semiconductor laser diode. $I_t$ and $P_t$ denote the laser-threshold current and the emitted optical output power at the laser threshold respectively.

FIG. 3C (PRIOR ART) illustrates an example of optical waveform exhibiting switching transients that could be obtained with the OPSP of FIG. 3A and corresponding to the current pulse of FIG. 3B. As shown in FIG. 3C, optical amplitude instabilities can occur at each transition of an OPSP for which one amplitude (initial or final) is set to a value corresponding to a current higher than $I_t$ while the other amplitude (final or initial) is set to a value lower than $I_t$.

FIGS. 4A to 4C illustrate how the present invention may be used to improve the stability of the optical pulses generated in the example of FIGS. 3A to 3C.

In both FIGS. 3A and 4A, the OPSP may be said to include two processing periods, a first processing period 60 corresponding to time intervals $\Delta t_1$, $\Delta t_2$ and $\Delta t_3$, and a second processing period 62 being embodied by interval $\Delta t_5$. As seen in FIG. 3C, switching transients would normally appear at the onset and at the end of each of these conditioning periods.

FIG. 4A shows the addition of conditioning periods 64 immediately prior and immediately following each processing period. The conditioning bins are represented with a crosshatched background. The first conditioning period 64 corresponds to the end of interval $\Delta t_0$, in which a single bin immediately preceding the low to high transition occurring between intervals $\Delta t_0$ and $\Delta t_1$ has been used to mitigate the pulse amplitude instability on the leading edge of the optical pulse corresponding to the first processing period 60. In that case, the programmed amplitude is slightly higher than $V_t$. The other conditioning periods 64 occur within intervals $\Delta t_1$ and $\Delta t_6$, where the same method has been applied with different numbers of conditioning bins and different programmed amplitudes for those bins. Two bins of equal amplitude have been programmed to mitigate the transient at the high to low transition occurring between intervals $\Delta t_3$ and $\Delta t_4$. For the transition $\Delta t_4 \rightarrow \Delta t_5$, three consecutive bins have been used right before the transition, with increasing amplitudes; the amplitude of the first bin is smaller than $V_t$, the amplitude of the second bin is equal to $V_t$, whereas the amplitude of the third bin is slighty higher than $V_t$. Finally, in the last conditioning period, corresponding to beginning of interval $\Delta t_6$, a single bin has been programmed with an amplitude lower than $V_t$, right after the transition $\Delta t_5 \rightarrow t_6$. FIG. 4B and FIG. 4C are modified versions of FIG. 3B and FIG. 3C, respectively, where the conditioning bins defined above have been added with a crosshatched background. As can be seen in FIG. 4C, as compared with FIG. 3A, the optical pulse amplitude profile obtained following the application of the present method is free of amplitude noise at the critical transitions.

Those skilled in the art may note that a side effect of the method according to embodiments of the invention is the addition of small pedestals in the optical pulse amplitude profile emitted by the laser diode near the critical amplitude transitions. It has been found, however, that the impact of such features can usually be kept negligible at the output of a MOPA system, as long as the pedestal current remains in the same order as $I_t$. Typically, very high peak amplitude to pedestal amplitude ratios (e.g. >1000:1) can be obtained because of optical gain saturation effects, nonlinear conversion processes (for lasers employing harmonic modules for example), or spectral filtering by selective elements, as the spectral bandwidth corresponding to the pedestal is usually broader than the linewidth of the main pulses. Alternatively, the pedestal can be removed by gating the optical pulse with an amplitude modulator located downstream to the seed laser diode, this modulator being driven in synchronization with the processing periods of the pulse shaping signal, at least partially, so as to be closed when the output generated during the conditioning periods impinge thereon and therefore block the unwanted pedestals while transmitting the power emitted during the processing periods. The GATE signal shown in FIG. 2B could be used for this purpose.

The OPSPs appearing in the examples of FIG. 3 and FIG. 4 are arbitrary, and are presented purely for the sake of explanation. It will be understood by those skilled in the art that the method can be applied to any OPSP in which switching transients are to be mitigated.

FIGS. 5A and 5B and FIGS. 6A and 6B present an experimental demonstration of the efficiency of the method for improving the pulse amplitude stability. The results were obtained with a 1.5 watt MOPAW Green fiber (trademark) laser from INO, Quebec, Canada. The laser architecture is based on a directly modulated semiconductor laser diode seeding a fiber amplifier chain, using a second harmonic generation (SHG) module to convert the 1064 nm fundamental wavelength to 532 nm. The system provides pulse shaping flexibility, with rise times and fall times typically smaller than 1 ns and 2 ns, respectively. Up to 64 temporal bins with 2.5 ns duration per bin can be used to define tailored OPSPs having total durations in the range of 2.5 ns to 160 ns. The amplitude of each bin can be adjusted finely, as 1024 levels are available for this instrument. More details about the programmable pulse shaping platform embedded in the MOPAW Green laser can be found in WO 2009/155712 (DELADURANTAYE et al.).

Figure 5A:
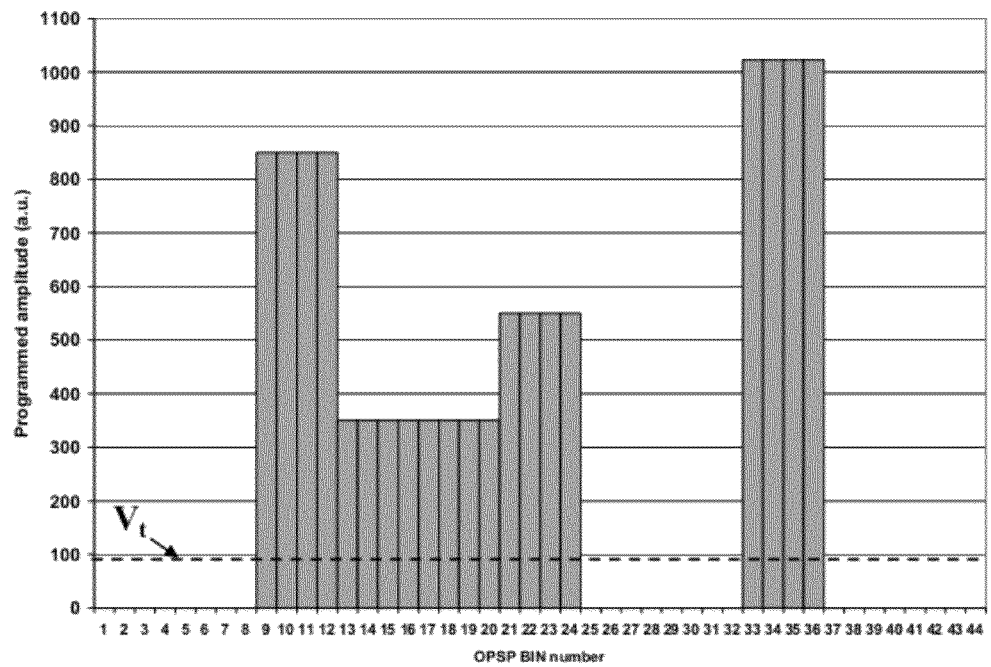
FIG. 5A (PRIOR ART) illustrates the pulse shaping signal applied to a laser system provided with pulse shaping capacity.
Figure 5B:
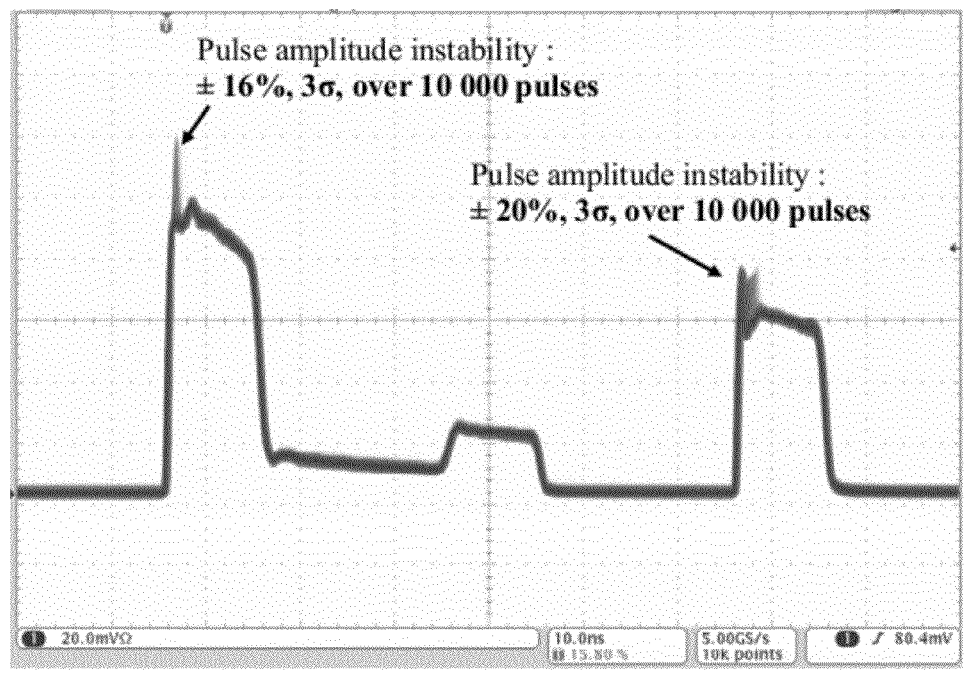
FIG. 5B (PRIOR ART) shows the resulting output of this laser.
Figure 6A:
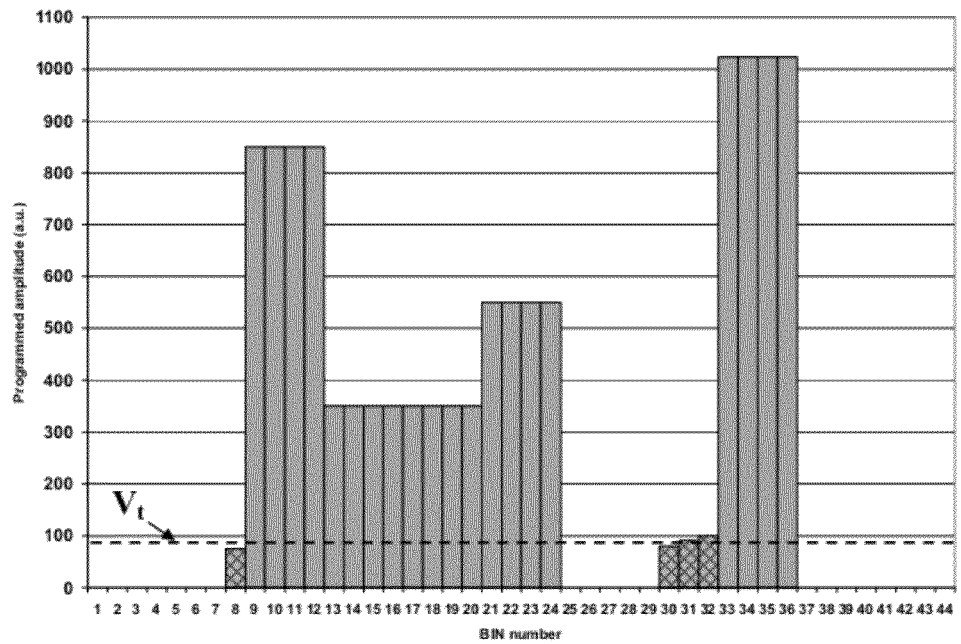
FIG. 6A illustrates the pulse shaping signal applied to a laser system provided with pulse shaping capacity, in accordance with one embodiment of the invention.
Figure 6B:
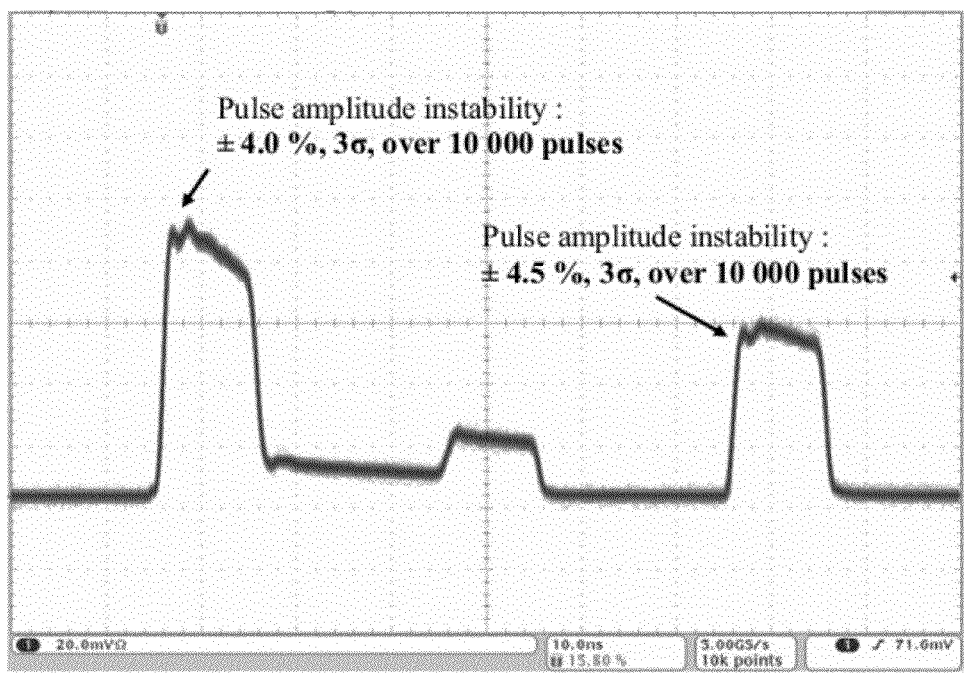
FIG. 6B shows the resulting output of this laser.

FIG. 5A (PRIOR ART) shows an OPSP similar to the OPSP of FIG. 3A, that was programmed using the MOPAW Green laser. In FIG. 5B (PRIOR ART), an oscilloscope screenshot shows the corresponding pulse amplitude profile detected at the output of the system. As can be seen in FIG. 5B, pulse amplitude instabilities occur at two critical leading edges in the pulse waveform, corresponding to the transitions $\Delta t_0 \rightarrow \Delta t_1$ and $\Delta t_4 \rightarrow \Delta t_5$, by analogy with FIG. 3A, whereas no transients are observed at the critical falling edges for this specific laser. Pulse amplitude instabilities of the order of ±20%, as shown in FIG. 5B, are not acceptable for many industrially important applications, as explained above. Practitioners often require pulse amplitude instability levels smaller than ±5% for satisfactory processing. FIG. 6A presents a modified OPSP that was employed for improving the pulse amplitude stability of the pulse presented in FIG. 5B. As can be seen in FIG. 6A, additional bins (appearing with a crosshatched background) have been added in two different conditioning periods of the OPSP, in a way similar to the case presented in FIG. 4A, except that no conditioning bins were required following the high to low transitions. As can be seen in FIG. 6B, a fourfold improvement of the optical pulse amplitude stability was obtained with respect to FIG. 5B. It is believed that the improvement factor is even higher, given the fact that most of the remaining amplitude instability appearing in FIG. 6B is due to detection noise, as those skilled in the art will appreciate by comparing the oscilloscope trace thickness of the zero amplitude level with that of the peak of the pulse.

One skilled in the art will also understand that an optimal waveform for a given conditioning period may be determined using a trial-and-error technique. For example, in the example of FIG. 4A, attempts were made with a single conditioning bin immediately preceding the $\Delta t_4 \rightarrow \Delta t_5$ transition. However, as opposed to the $\Delta t_0 \rightarrow \Delta t_1$ transition, it was noted that occasional transients events (perhaps 1 pulse over 100 000) still occurred with the bin amplitude set to a value more than twice as high as $V_t$, in which case the associated pedestal became significant in the outputted optical pulse. Using three bins with amplitudes set close to $V_t$ solved the issue, as shown in FIG. 6. Alternatively, a model based on details of the seed laser diode internal dynamics in the context of tailored amplitude profiles at the nanosecond time scale could be built to predict this transient response for a given laser system. Such a model could predict the dynamics of longitudinal mode competition occurring during the shaped pulse, and would preferably include dominant factors such as the time-dependent wavelength chirp and the seed laser diode chip operating temperature.

In accordance with another embodiment of the invention, with reference to FIG. 7A, there is preferably provide a retroaction loop 66, to provide an error signal to the digital pulse shaping module 26 generating the pulse shaping signal 24. The retroaction loop preferably includes a tap coupler 70, or other appropriate sampling device apt to extract a portion of the output of the pulsed laser system. The extracted portion is detected by a photodetector 72, providing a feedback electrical signal 68 which is preferably forwarded to the digital pulse shaping module 26 for processing.

Referring to FIG. 7B, the retroaction loop preferably performs the following substeps:

i. detecting 74 a portion of the output of the pulsed laser system. This is preferably achieved through the use of a tap coupler and photodetector are illustrated in FIG. 7A, although other arrangements could also be considered.

ii. processing the signal detected at i. This is preferably performed by appropriate components in the digital pulse shaping module or connected thereto. This processing allows extracting 76 information related to pulse amplitude stability, and generate 78 a corresponding error signal which is representative of the difference between the measured pulse amplitude stability and the targeted pulse amplitude stability. The expression "pulse amplitude stability" is understood to refer to the relative pulse to pulse variation of the amplitude of the optical pulses for a given number of detected pulses. For example, this parameter can be measured by acquiring the optical shape using a photodetector and an oscilloscope in infinite persistence for an acquisition time corresponding to the desired number of pulses (e.g. 10 000 pulses). The pulse amplitude stability is calculated from the ratio of the oscilloscope trace thickness with respect to the average pulse amplitude. Of course, other calculation methods may also be considered.

iii. the controlling of the pulse shaping signal is adapted in view of the error signal. In practice, the digital pulse shaping module may for example compare 80 the error signal with a pre-programmed error threshold. If the error signal is below this threshold, then the output is considered sufficiently stable and there is no need for action. If the error signal is above the error threshold, then the conditioning bins are modified 82, for example by adding or removing bins and/or changing their amplitude. The pulse shaping signal incorporating the modified conditioning bins is then used to drive 84 the laser diode.

Of course, numerous modifications could be made to the embodiments described above without departing from the scope of the invention as defined in the appended claims.

The invention claimed is:

1. A method for stabilizing an output of a pulsed laser system, said output being controlled using a pulse shaping signal directly modulating a drive current of a laser diode within said laser system to obtain a desired temporal shape of said output, the method comprising a step of a) controlling the pulse shaping signal to define over time:
- at least one processing period wherein the pulse shaping signal has an amplitude profile tailored so as to produce the desired temporal shape of the output; and
- at least one conditioning period, either immediately preceding or immediately following one of the at least one processing periods, wherein the amplitude profile of the pulse shaping signal is tailored so that the drive current of the laser diode is lower than a maximum value of said drive current during the corresponding processing period, and is of a same order of magnitude as a laser threshold current of said laser diode, whereby a stability of said output during the corresponding processing period is improved.

2. The method according to claim 1, wherein said laser diode is selected from the group consisting of Fabry-Perot laser diodes, distributed feedback laser diodes and distributed Bragg reflector laser diodes.

3. The method according to claim 1, wherein said laser diode is wavelength-locked.

4. The method according to claim 1, wherein said laser diode is wavelength-tunable.

5. The method according to claim 1, wherein, during said conditioning period, the amplitude profile of the pulse shaping signal is such that the drive current of the laser diode is lower than twice the laser threshold current of the laser diode.

6. The method of claim 1, comprising a preliminary step of providing a digital pulse shaping module for generating said pulse shaping signal, comprising:
- a clock generator generating a plurality of phase-related clock signals at a same clock frequency;
- a shape generator outputting a digital shape signal corresponding to a digital input waveform, said shape generator operating in Double Data Rate in response to said clock signals;
- a Digital-to-Analog Converter, hereinafter DAC, receiving the digital shape signal and converting the same into an analog shape signal; and
- a shape buffer driver receiving the analog shape signal and generating said pulse shaping signal.

7. The method according to claim 6, wherein said digital pulse shaping module further comprises a shape memory buffer storing a plurality of predetermined waveforms, and the shape generator comprises selecting means for selecting any one of said predetermined waveforms as the digital input waveform.

8. The method according to claim 1, comprising an additional step of gating the output with an amplitude modulator located downstream the laser diode, the amplitude modulator being driven in synchronization with the processing periods of the pulse shaping signal.

9. The method according to claim 1, comprising an additional step of providing said pulsed laser system with a retroaction loop, said additional step comprising:
  i. detecting at least a portion of the output of the pulsed laser system;
  ii. processing the signal detected at i. to extract therefrom information related to pulse amplitude stability, and generating a corresponding error signal;
  iii. adapting the controlling of step a) in view of said error signal.

10. The method according to claim 1, further comprising passing said output through an optical harmonic converter, said optical harmonic converter converting a fundamental wavelength of said output to an harmonic thereof.

* * * * *